United States Patent [19]

Andoh

[11] Patent Number: 5,358,165
[45] Date of Patent: Oct. 25, 1994

[54] AUTOMATIC WIRING MACHINE OF CORONA DISCHARGE DEVICE

[75] Inventor: Jun Andoh, Atsugi, Japan

[73] Assignee: Ricoh Company, Ltd., Tokyo, Japan

[21] Appl. No.: 60,540

[22] Filed: May 13, 1993

[30] Foreign Application Priority Data

Jul. 27, 1992 [JP] Japan .................................. 4-220833

[51] Int. Cl.⁵ .......................................... H05K 13/06
[52] U.S. Cl. ........................................ 228/4.1; 228/13
[58] Field of Search ............. 228/179.1, 180.21, 180.5, 228/110.1, 1.1, 4.5, 4.1, 13, 5.1

[56] References Cited

U.S. PATENT DOCUMENTS 3,643,321  2/1972  Field et al. .......................... 228/4.5
4,950,866  8/1990  Kojima et al. ..................... 228/110.1
5,152,450  10/1992  Okikawa et al. ..................... 228/4.5

*Primary Examiner*—Samuel M. Heinrich
*Attorney, Agent, or Firm*—Oblon, Spivak, McClelland, Maier & Neustadt

[57] ABSTRACT

An automatic wiring machine of a corona discharge device with a wire wound around a spool by displacement of a head, comprises a head for wiring along a wiring pattern of the corona discharge device set on a palette and holding the wire, a tension device for applying a required tension to the supplied wire when the head carries out wiring, a welding machine for welding an arranged wire onto the corona discharge device and fixing the wire and a cutting device for cutting an unnecessary portion of the wire.

3 Claims, 6 Drawing Sheets

AUTOMATIC WIRING MACHINE OF CORONA DISCHARGE DEVICE

BACKGROUND OF THE INVENTION

1. Field of the Invention

The present invention relates to an automatic wiring machine for automatically wiring with a wire and fixing it onto a corona discharge device like an electrical charge charger, a transfer charger, and a separation charger.

2. Description of the Related art

An electrophotographic machine such as a copying machine or the like which obtains a copy image corresponding to an original image by scanning the original, comprises an electrical charge charger used for forming an electrostatic latent image on a photoreceptor, a transfer charger for developing the latent image by the electrical charge charger and transferring a visual image on a transfer paper, and further a separation charger for separating the transfer paper having a transferred visual image from the photoreceptor.

In such a corona discharge device, metal members are generally fixed on both ends of the discharge wire respectively.

One metal member is held by a pin fixed on a case through a hole portion. The other metal member is provided with a spring. An urging force of the spring allows the wire to be attached on the case at a predetermined tension. One end of the wire may be fixed to a leaf spring member.

As aforementioned, the discharge wire in the conventional corona discharge device is stretched at a predetermined tension by using an urging force produced by the spring and the leaf spring member attached on one end thereof, and the wire is fixed while applying thereto the tension. Therefore, such wiring operation is extremely troublesome, very difficult to be automated by a machine, and can not help relying on manual labor.

SUMMARY OF THE INVENTION

It is, therefore, an object of the present invention to provide an automatic wiring machine of a corona discharge device aiming at improving an efficiency of wiring operation by automating wiring in the corona discharge device.

The object of the present invention can be achieved by an automatic wiring machine of a corona discharge device with a wire wound around a spool by displacement of a head. The head for wiring along a wiring pattern of the corona discharge device is set on a palette and holds the wire. A tension device is provided applying a required tension to the supplied wire when the head carries out wiring. A welding machine welds an arranged wire onto the corona discharge device and fixes the wire. Finally, and a cutting device cuts an unnecessary portion of the wire.

In an automatic wiring machine according to the present invention, when assembling a corona discharge device, it becomes possible to carry out automatic wiring in a corona discharge device, which has relied conventionally on manual labor. A mechanism for wiring with a wire, fixing a wire, pressurizing the wire, and cutting an unnecessary wire is incorporated in the automatic wiring machine.

In the automatic wiring machine according to the present invention, the wire fed through a nozzle may be guided by a roller. This prevents the wire from being bent by rubbing and damaged.

The automatic wiring machine according to the present invention may be further provided with means for separating the wire from the case of the corona discharge device when fixing the wire. Thus, it becomes possible to prevent the wire from changing in height and in tension due to weld penetration of the wire into the case at the time of welding.

Further object and advantages of the present invention wi 11 be apparent from the following description of the preferred embodiments of the invention as illustrated in the accompanying drawings.

BRIEF DESCRIPTION OF THE DRAWINGS

FIG. 10b is a side view of the nozzle corresponding to that of FIG. 10a;

DESCRIPTION OF THE PREFERRED EMBODIMENTS

Figure 1:
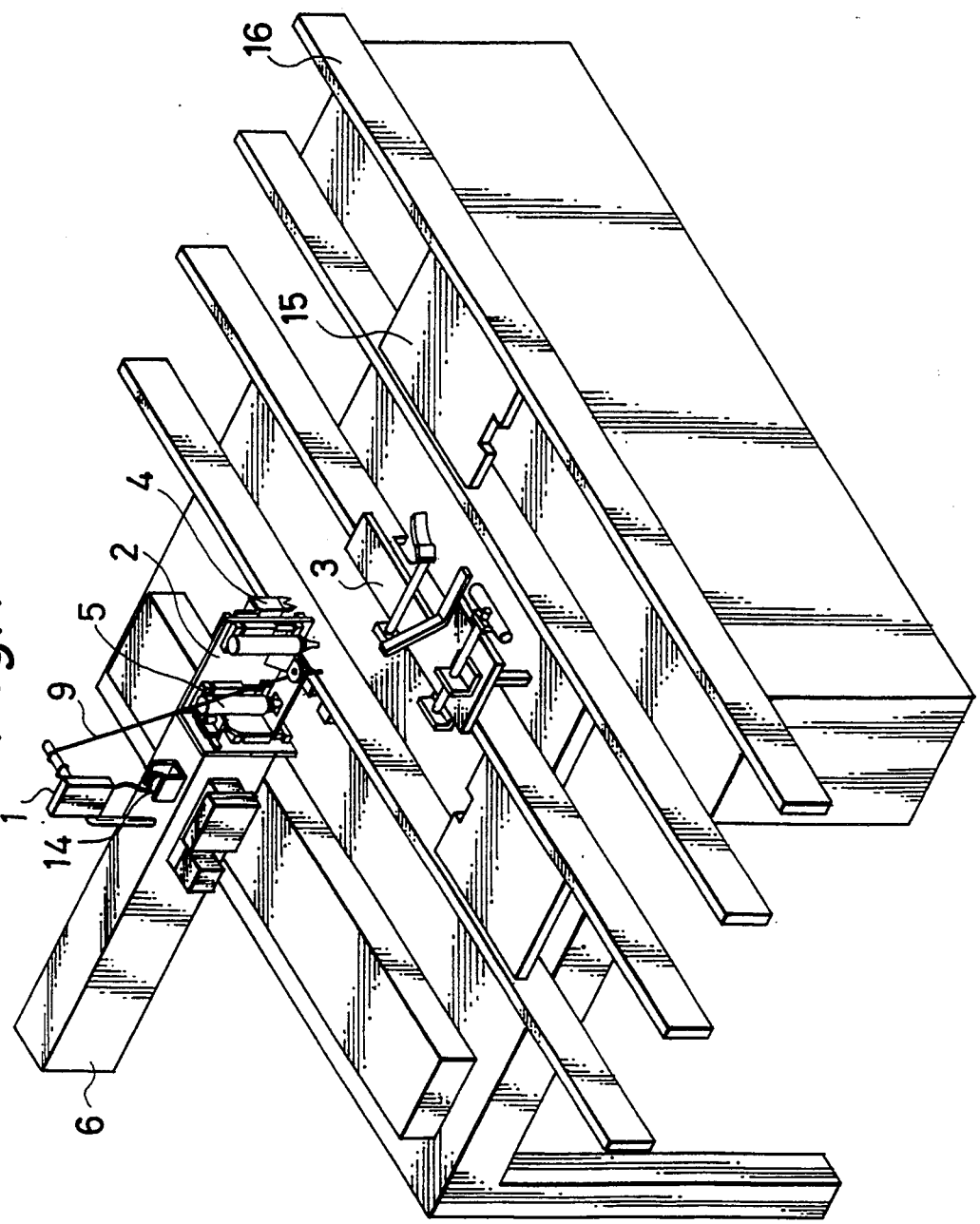
FIG. 1 is a perspective view of one embodiment of an automatic wiring machine of the present invention combined with a conveyor.

Embodiments of the present invention will be described hereinafter with referring to the drawings.

A structure of an automatic wiring machine will be explained hereinafter, referring to FIG. 1.

The automatic wiring machine includes a tension device 1 for applying a predetermined tension to a wire 9 during wiring, a head portion 2 for wiring with a wire 9, a jig portion 3 for positioning a work, a cutting device 4 for cutting an unnecessary wire 9, a welding device 5 for fixing the wire 9, a robot 8 for moving the head portion 2, the cutting device 4 and the welding machine 5, a pallet 15 for mounting a corona discharge device, and a conveyor 16 for carrying the palette 15. The wire 9 is supplied from a spool 14. In FIG. 1, one robot 8 is provided with the welding machine 5, the head portion 2 and the cutting device 4, while they may be attached onto respective robots in some cases.

Figure 2:
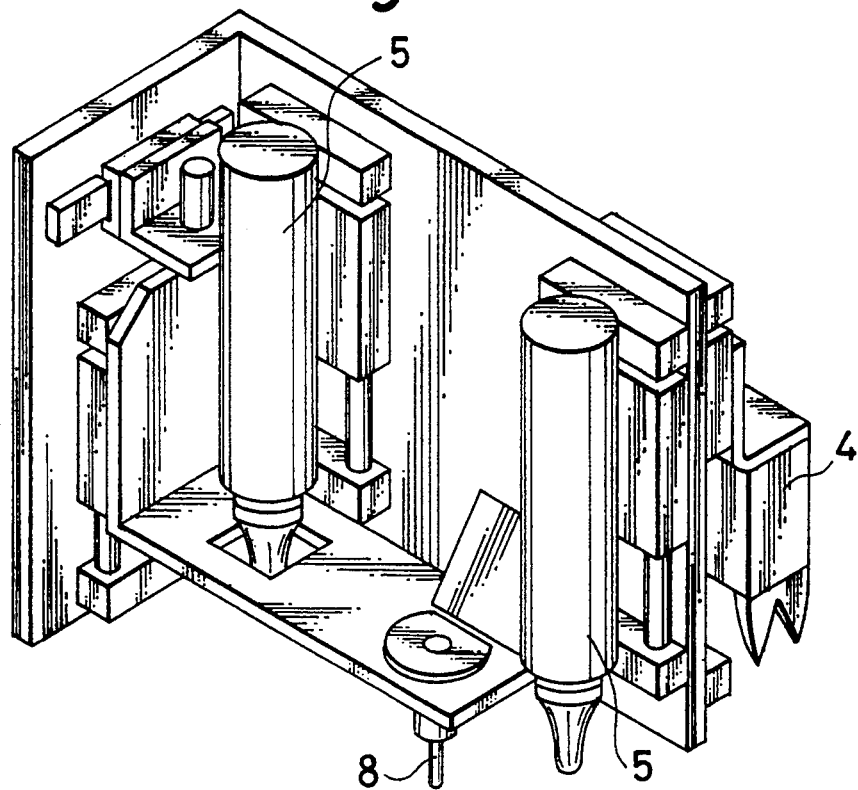
FIG. 2 is a partially enlarged perspective view for showing a detail of a head portion of the automatic wiring machine of FIG. 1.
Figure 3:
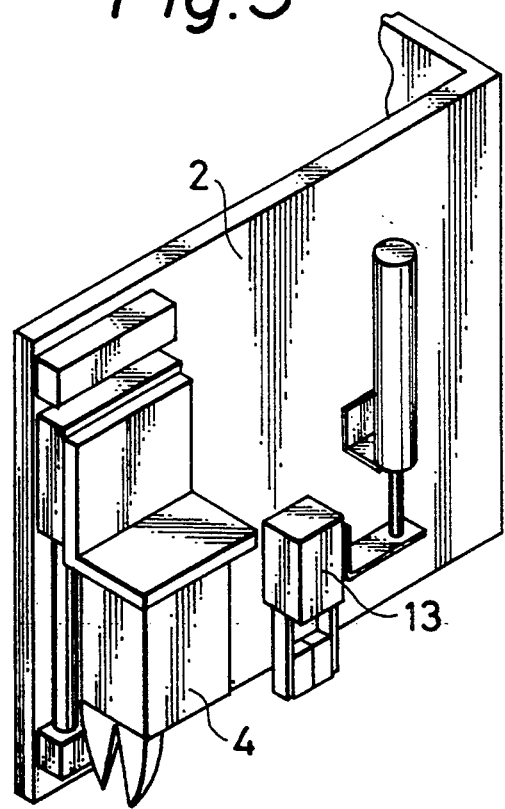
FIG. 3 is a partially enlarged perspective view for showing a detail of the head portion of the automatic wiring machine of FIG.

A structure of the head portion 2 of the automatic wiring machine of FIG. 1 will be explained hereinafter with reference to FIGS. 2 & 3. The head portion 2 has the nozzle 8 for feeding the wire 9 with displacement of the head portion 2, and a hand 13 for clamping the wire 9, as well as the cutting device 4 and the welding machine 5.

Figure 4:
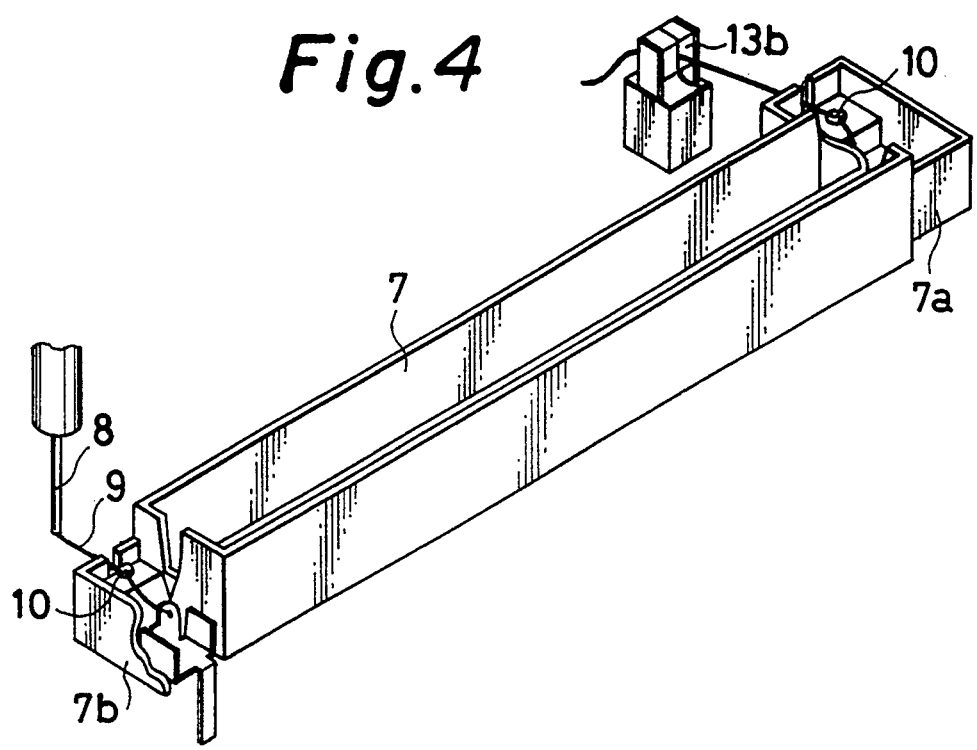
FIG. 4 is a perspective view for showing an operation of the automatic wiring machine of FIGS. 1 to 3.
Figure 5:
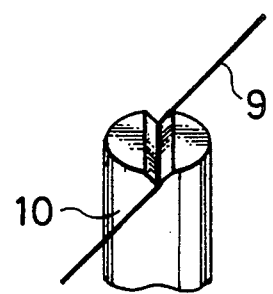
FIG. 5 is a perspective view for showing an operation of the automatic wiring machine of FIGS. 1 to 3.
Figure 6:
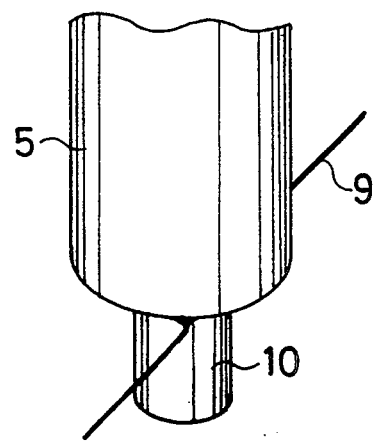
FIG. 6 is a perspective view for showing an operation of the automatic wiring machine of FIGS. 1 to 3.
Figure 7:
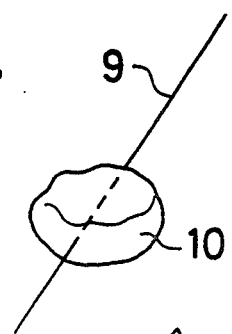
FIG. 7 is a perspective view for showing an operation of the automatic wiring machine of FIGS. 1 to 3.
Figure 8A:
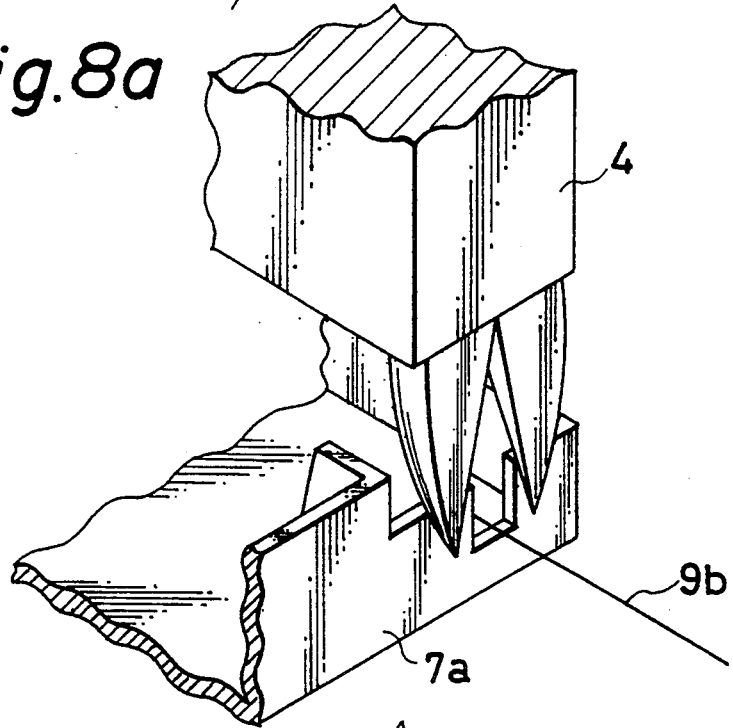
FIG. 8a and FIG. 8b are perspective views for showing an operation of the automatic wiring machine of FIGS. 1 to 3.
Figure 8B:
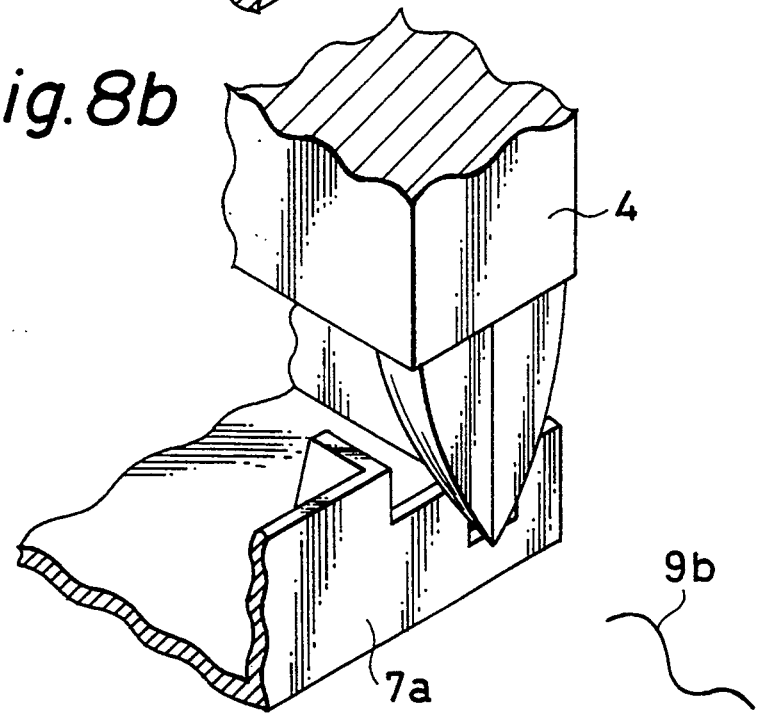

An operation of the aforementioned automatic wiring machine will be explained hereinafter with reference to FIGS. 4 to FIG. 8a and FIG. 8b. The wire 9 wound around the spool 14 is applied tension by the tension device 1. The wire 9 passes through the nozzle 8 and is clamped at the leading edge thereof by the hand 13. In such a state, the corona discharge device 7 is set. Then, the jig portion 3 positions the corona discharge device 7. The wire 9 is clamped by a hand 13b mounted on the fixture portion 3 and the head portion 2 begins to move. By the displacement of the head portion 2, the wire 9 is fed from the nozzle attached to the head portion 2, and is stretched between end blocks 7a and 7b (FIG. 4). The tension of the wire 9 is maintained constantly during wiring by the tension device 1. The wire 9 is welded by the welding machine 5, and is fixed onto a weld pin 10 mounted on the corona discharge device 7 (FIG. 5 to FIG. 7). After the wire is clamped by the hand 13, an unnecessary portion of the wire 9b is cut by the cutting device 4 (FIG. 8a and FIG. 8b).

Figure 9:
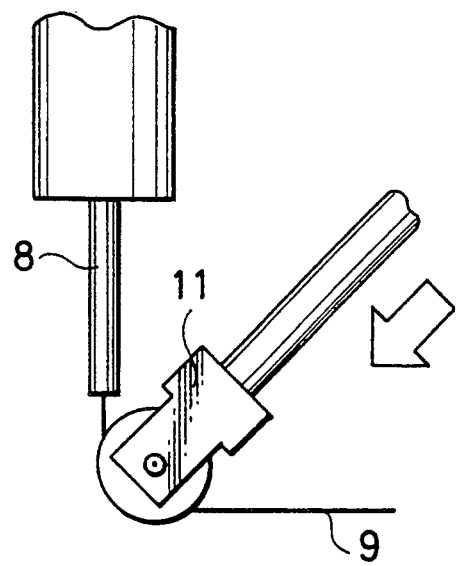
FIG. 9 is a side view for showing a structure and an operation of a mechanism for preventing wire rubbing.
Figure 10A:
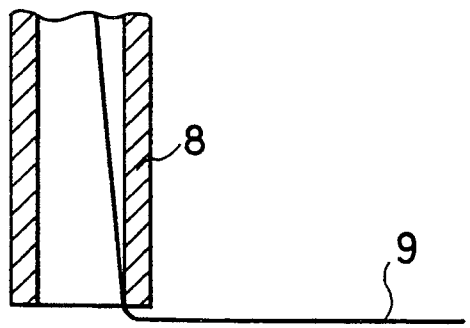
FIG. 10a is a cross-sectional view of a nozzle showing a state in which a wire is bent and damaged due to rubbing of the wire.
Figure 10B:
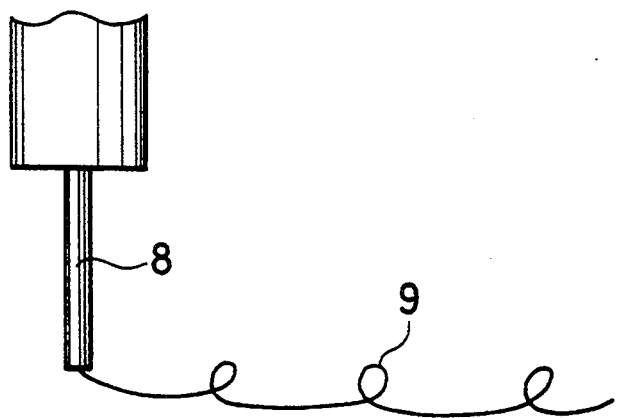

A structure and an operation of the mechanism for preventing the wire 9 from rubbing will be explained hereinafter, with reference to FIG. 9. At a leading edge of the nozzle 8 attached to the head portion 2 of the automatic wiring machine, a roller is applied onto the wire 9 during feeding of the wire 9 to prevent the wire from rubbing. The mechanism for preventing the wire 9 from rubbing prevents the wire 9 from being bent (FIG. 10a) and rounded (FIG. 10b) by the rubbing of the wire 9 against the leading edge of the nozzle 8, and thereby from being damaged.

Figure 11:
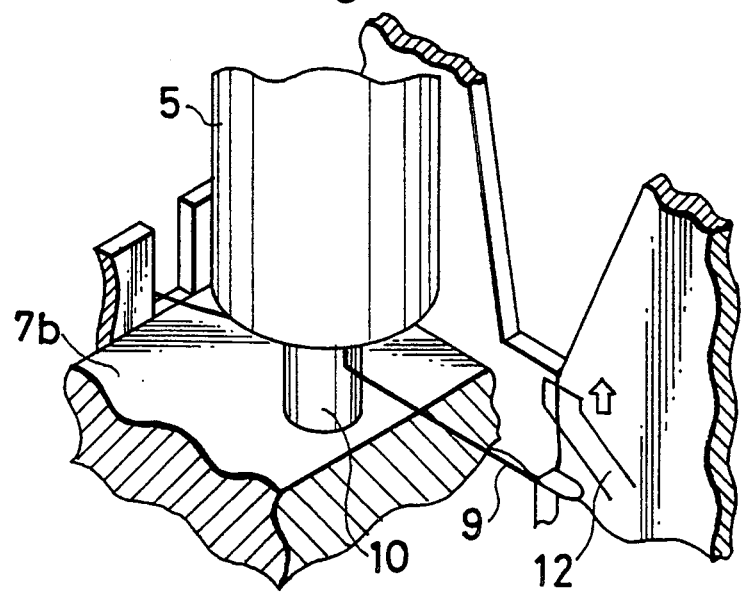
FIG. 11 is a partial perspective view for showing a structure and an operation of a mechanism for preventing weld penetration of the wire.

FIG. 11 is a partial perspective view for showing a structure and an operation of a mechanism for preventing weld penetration of the wire 9.

Figure 12A:
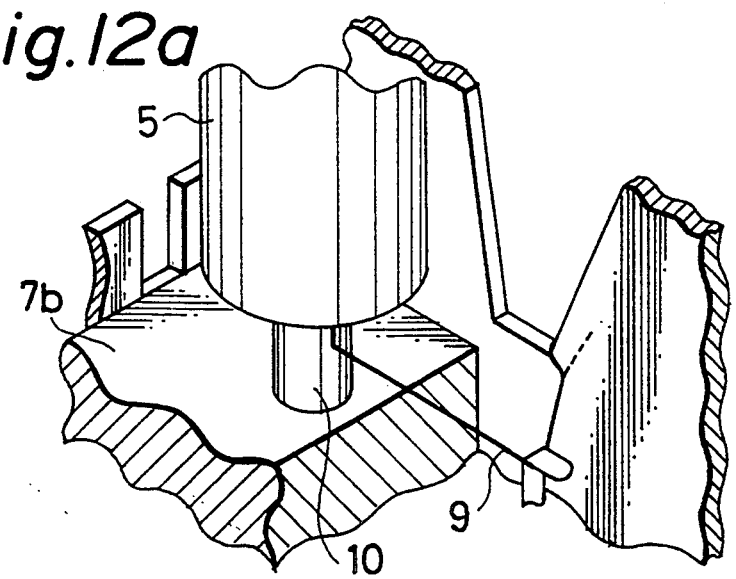
FIG. 12a and FIG. 12b are partial perspective views for showing a welding state the wire.
Figure 12B:
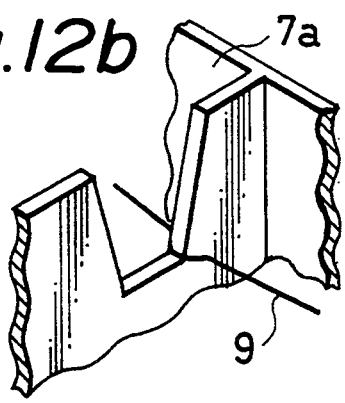

After wiring with the wire 9, when the wire 9 is welded by the welding machine 5 to be fixed onto the weld pin 10 mounted on the corona discharge device 7, the lever 12 is applied to the wire 9 to float the wire 9 from the case of the corona discharge device 7, thereby preventing the wire 9 from penetrating into the case. As shown in FIG. 12a and FIG. 12b, the mechanism prevents the wire from changing in height and in tension by the weld penetration of the wire 9 into the end blocks 7a, 7b of the case of the corona discharge device 7, when welding the wire 9 to fix it.

Many widely different embodiments of the present invention may be constructed without departing from the spirit and scope of the present invention, It should be understood that the present invention is not. limited to the specific embodiments described in the specification, except as defined in the appended claims.

What is claimed is:

1. An automatic wiring machine for wiring a corona discharge device with a wire wound around a spool by displacement of a head, comprising:

a head for wiring a wire through a nozzle along a wiring pattern of the corona discharge device set on a palette and holding the wire;

a tension device for applying a required tension to the supplied wire when said head carries out the wiring;

a welding machine for welding an arranged wire onto the corona discharge device and for fixing the wire; and a cutting device for cutting an unnecessary portion of the wire, said wire through the nozzle being guided by a roller.

2. An automatic wiring machine according to claim 1, further comprising means for separating said wire from a casing of the corona discharge device when fixing the wire.

3. An automatic wiring machine according to claim 2, wherein said separating means is a lever.

* * * * *